United States Patent
Kikuchi et al.

(10) Patent No.: US 6,838,773 B2
(45) Date of Patent: Jan. 4, 2005

(54) SEMICONDUCTOR CHIP AND SEMICONDUCTOR DEVICE USING THE SEMICONDUCTOR CHIP

(75) Inventors: Yuji Kikuchi, Ibaraki (JP); Kiyoharu Kishimoto, Yokohama (JP); Kazunari Nakagawa, Tokyo (JP); Yoshiharu Hino, Moriya (JP)

(73) Assignee: Hitachi Maxell, Ltd., Osaka (JP)

( * ) Notice: Subject to any disclaimer, the term of this patent is extended or adjusted under 35 U.S.C. 154(b) by 0 days.

(21) Appl. No.: 10/311,707

(22) PCT Filed: Jun. 20, 2001

(86) PCT No.: PCT/JP01/05282

§ 371 (c)(1),
(2), (4) Date: Dec. 19, 2002

(87) PCT Pub. No.: WO01/99193

PCT Pub. Date: Dec. 27, 2001

(65) Prior Publication Data

US 2003/0116790 A1 Jun. 26, 2003

(30) Foreign Application Priority Data

Jun. 21, 2000 (JP) ........................................ 2000-186409

(51) Int. Cl.[7] .............................................. H01L 23/48
(52) U.S. Cl. ........................ 257/773; 257/786; 257/659; 257/503
(58) Field of Search ................................ 257/773, 786, 257/659, 503, 531, 758, 369, 737

(56) References Cited

U.S. PATENT DOCUMENTS 6,380,567 B1 * 4/2002 Okitaka ........................ 257/211
6,525,410 B1 * 2/2003 Gelsomini et al. ............ 257/678
2003/0116790 A1 * 6/2003 Kikuchi et al. ................ 257/208

FOREIGN PATENT DOCUMENTS

| JP | 10-162112 A | 6/1998 |
| JP | 2000-137779 A | 5/2000 |

* cited by examiner

Primary Examiner—Mark V. Prenty
(74) Attorney, Agent, or Firm—Birch, Stewart, Kolasch & Birch, LLP

(57) ABSTRACT

A semiconductor chip of rewiring layer-integral type capable of preventing a maloperation by noise and a deterioration of communication characteristics and a semiconductor device with excellent communication characteristics; the semiconductor chip, wherein a rewiring layer (3) is formed on a circuit formed surface (1a) through an insulating layer (2) so as to form an antenna coil (4) with the rewiring layer (3), the antenna coil (4) is formed around the periphery of an analog circuit (21) on the circuit formed surface (1a) by avoiding forming on the analog circuit (21), the analog circuit (21) may be formed by collecting analog circuits to be formed in the semiconductor chip (1A) therein, may be one of the particularly noise-susceptible analog circuits such as a power circuit, a calculation amplifier, a comparison amplifier, an RF receiving part, an RF transmitting part, an RF synthesizer part, and a voltage build-up circuit and an amplifying circuit forming a part of a memory part, or may be a coil provided in a part of the analog circuit formed in the semiconductor chip (1A).

8 Claims, 12 Drawing Sheets

US 6,838,773 B2

SEMICONDUCTOR CHIP AND SEMICONDUCTOR DEVICE USING THE SEMICONDUCTOR CHIP

This application is the national phase under 35 U.S.C. §371 of PCT International Application No. PCT/JP01/05282 which has an International filing date of Jun. 20, 2001, which designated the United States of America.

TECHNICAL FIELD

The present invention relates to a semiconductor chip having a rewiring layer formed on a circuit-formed region through an insulating layer in such a manner as to be integral with the chip, and also to a semiconductor device having this semiconductor chip mounted on it, and more particularly concerns an arrangement of the rewiring layer.

BACKGROUND ART

Card-type, tag-type and coin-type semiconductor devices, which have semiconductor chips mounted thereon, are widely spreading to the industries, such as transportation, distribution and communications for their large information capacity and high security performance. Above all else, non-contact communication type semiconductor devices, which have recently been developed, are gaining popularity because of their characteristics. Specifically, outside terminals are not provided on the substrate, power is supplied from the reader/writer to the card by wireless, and signals are exchanged by wireless between the reader/writer and the card. For this reason, the outside terminals are primarily not subject to damage as are the contact type semiconductor devices, and the non-contact devices are easier to handle during storage and so on, and can stand long periods of use, less vulnerable to falsification of data and superior in security performance. Therefore, the non-contact semiconductor devices are expected to be employed in a wider range of applications.

As the semiconductor chips mounted on non-contact semiconductor devices of this kind, those semiconductor devices have been used which are not provided with an antenna coil for non-contact communications to receive power supply from an external device without contact and to send and receive signals to and from the external device without contact. Recently, as shown in FIGS. 16 and 17, there has been proposed a semiconductor chip of coil-on-chip type 1 in which a rewiring layer 3 is formed on a circuit-formed surface through an insulating layer 2, and an antenna coil 4 made up of the rewiring layer 3 is formed integral with the chip.

If a coil-on-chip type semiconductor chip 1 is used, it becomes unnecessary to provide an antenna coil separately and, therefore, it is unnecessary to connect the antenna coil to the semiconductor chip and take some measure to protect this connection. This facilitates the manufacture of non-contact semiconductor devices, and reduces production cost.

In late years, there has been proposed a chip scale package type semiconductor chip (hereafter referred to as a CSP) 8 as a semiconductor chip to be mounted on semiconductor devices regardless of whether they are of non-contact type or contact type. As shown in FIGS. 18 and 19, the CSP type semiconductor chip is produced by a following procedure. A rewiring layer 3 is formed, through an insulating layer 2, on a circuit-formed surface of a semiconductor chip which has a plurality of input/output terminals (pads) 5 formed along the periphery of the semiconductor chip, and bump-setting wires 6 are formed from the rewiring layer 3 and are laid out on the whole surface of the semiconductor chip. Each bump-setting wire 5 is connected at one end to an input/output terminal 5 and has a corresponding bump 7 formed at the other end of the wire.

If this CSP type semiconductor chip 8 is used, the bumps 7 can be laid out freely on the whole surface of the semiconductor chip 8, for which reason the array pitch and the size of bumps 7 can be made larger than in a case where the bumps 7 are formed on the input/output terminals 5 placed along the periphery of the semiconductor chip, and the number of the input/output terminals 5 can be increased and flip-chip mounting of semiconductor chips can be made easier.

Incidentally, as shown in FIGS. 16 and 18, the parts provided in separate blocks, marked off on the circuit-formed surface of the semiconductor chip to be applied to a semiconductor device, are a power circuit 11, an operational amplifier (Op-Amp) 12, a comparison amplifier (comparator) 13, an RF receiving part 14, an RF transmitting part 15, an RF synthesizer 16, a logic block 17, and a memory block 18. When a higher security performance is required, a microprocessor is sometimes included. The power circuit 11, the operational amplifier 12, the comparison amplifier 13, an RF receiving part 14, an RF transmitting part 15 and the RF synthesizer 16 are most often formed by analog circuits. When the memory block 18 is formed by EEPROM memory elements, for example, an analog circuit, such as a voltage build-up circuit or an amplifier circuit, is included as a part of the memory block circuit. On the other hand, the logic block 17 is most often composed of digital circuits. Note that among the well-known semiconductor chips for use in semiconductor devices, there are some examples, in which a coil section is included as a part of the analog circuit.

In a coil-on-chip type semiconductor chip 1 and a CSP type semiconductor chip 8, which have a rewiring layer 3 formed integral with the chip, the circuit-formed surface of the semiconductor chip 1 or 8 and the rewiring layer 3 are formed close to each other through an insulating layer 2 of a relatively high dielectric constant, and therefore a parasitic capacitance C is formed between the circuit and the rewiring layer 3 as schematically shown in FIG. 20.

However, in a conventional coil-on-chip type semiconductor 1 and a conventional CSP type semiconductor chip 8, consideration has not been given to adverse effects when a parasitic capacitance C is formed at a position where an analog circuit is formed, and therefore the antenna coil 4 or the bump-setting wires 6 are formed face-to-face with the analog circuit as shown in FIGS. 16 through 19.

Therefore, in the conventional coil-on-chip type semiconductor chip 1 and CSP type semiconductor chip 8, parasitic capacitances C are formed between the analog circuit on the circuit-formed surface and the rewiring layer 3, and as electromotive force (AC) generated in the rewiring layer 3 is coupled with the parasitic capacitances C, electrostatic induction noise is produced, and moreover, crosstalk noise, ringing (LC resonance shift), power source noise or the like ascribable to the electrostatic induction noise occur. Owing to all such hindrances, those semiconductor chips are liable to malfunction and deteriorate in the communication characteristics.

In the conventional coil-on-chip type semiconductor chip 1 and CSP type semiconductor chip 8, the circuit-formed surface is formed across the insulating layer 2 from the rewiring layer 3, and for this reason electrostatic induction noise is likely to occur in circuits provided on the circuit-formed surface, and malfunction and communication performance deterioration tend to occur.

Noise, such as crosstalk noise, ringing and power source noise ascribable to the electrostatic induction noise or electromagnetic induction noise has significant impacts on the analog circuits, such as the power circuit 11, the operational amplifier 12, the comparison amplifier 13, the RF receiving part 14, the RF transmitting part 15, and the RF synthesizer 16, particularly on the operational amplifier 12 and the comparison amplifier 13 handling minute voltage waveforms, the voltage build-up circuit or the amplifier circuit included in the memory block 18 that handles micro signals, and the coil. Noise of those kinds has more serious effects on the circuits that handle higher frequencies of voltage waveforms and signals. For this reason, with high-frequency-compatible semiconductor chips that can be applied to cell phones, for example, it is necessary to suppress the occurrence of noise of the kinds mentioned above.

The present invention has been made to solve those problems and has as its object to provide a semiconductor chip of rewiring layer-integral type capable of preventing malfunction due to noise and deterioration of communication characteristics, and also provide a semiconductor chip with excellent communication characteristics.

DISCLOSURE OF THE INVENTION

To solve the above-mentioned problems, according to a first aspect of the semiconductor chip in the present invention, a semiconductor chip has a rewiring layer formed on a circuit-formed surface through the intermediary of an insulating layer in such a manner as to be integral with the chip, wherein the rewiring layer and all of or a part of analog circuit provided on the circuit-formed surface are arranged not to overlap each other through the insulating layer.

When the rewiring layer and the analog circuits provided on the circuit-formed surface of a semiconductor chip are arranged not to overlap each other through the insulating layer, a parasitic capacitance is not formed between the analog circuit and the rewiring layer and therefore electrostatic capacitance that affects the analog circuit can be prevented from occurring. Moreover, because the analog circuit and the rewiring layer are not arranged face-to-face with each other, electromagnetic induction noise that affects the analog circuit can be prevented from occurring. Accordingly, crosstalk noise, ringing, power source noise or the like ascribable to electrostatic induction noise or electromagnetic induction noise can be prevented. Also with the semiconductor chip of rewiring layer-integral type, it is possible to eliminate the malfunction due to noise and the deterioration in communication characteristics. Note that even if the rewiring layer is not arranged not to overlap all of the analog circuits provided on the circuit-formed surface, as long as the rewiring layer is arranged not to overlap particularly noise-susceptible analog circuits, malfunction and communication characteristics deterioration due to noise do not become an issue from a practical viewpoint. On the other hand, digital circuits are less susceptible to noise than analog circuits, and if the rewiring circuit is laid over a digital circuit provided on the circuit-formed circuit through an insulating layer, neither malfunction nor deterioration in the communication characteristics occurs in a semiconductor chip of rewiring layer-integral type.

According to a second aspect of the semiconductor chip of the present invention, a semiconductor chip has a rewiring layer formed on the circuit-formed surface through an insulating layer in such a manner as to be integral with the chip, wherein the rewiring layer and at least one of the power circuit, operational amplifier, comparison amplifier, RF receiving part, RF transmitting part, and RF synthesizer formed on the circuit-formed surface are arranged not to overlap each other through the insulating layer.

As has been described, the power circuit, operational amplifier, comparison amplifier, RF receiving part, RF transmitting part, and RF synthesizer are all too often composed of analog circuits susceptible to noise. Therefore, if those circuit blocks are arranged so as not to overlap the rewiring layer through the insulating layer, it is possible to prevent crosstalk noise, ringing and power source noise due to electrostatic induction noise or electromagnetic induction noise, and malfunction and deterioration in communication characteristics.

According to a third aspect of the semiconductor chip of the present invention, a semiconductor chip is structured to have a rewiring layer formed on the circuit-formed surface through an insulating layer in such a manner as to be integral with the chip, wherein a coil formed on the circuit-formed surface and the rewiring layer are arranged not to overlap each other through the insulating layer.

In a semiconductor chip having a coil formed on a circuit-formed surface, if the coil and the rewiring layer are arranged not to overlap each other through the insulating layer in the same manner as described above, the coil is less likely to be affected by electrostatic induction noise or electromagnetic induction noise, and ringing or the like can be prevented from occurring, with the result that malfunction and deterioration in communication characteristics due to noise can be prevented.

According to a fourth aspect of the semiconductor chip of the present invention, an antenna coil, connected at each end to an input/output terminal formed on the circuit-formed surface, for non-contact communication is formed from the rewiring layer.

As described above, when an antenna coil for non-contact communication is formed of the rewiring layer, a chip on coil can be obtained which is superior in resistance to noise, making it possible to produce a non-contact type semiconductor chip with excellent noise resistance at low cost.

According to a fifth aspect of the semiconductor chip of the present invention, bump-setting wires are formed from the rewiring layer, and wherein the bump-setting wires are connected at one end to input/output terminals formed on the circuit-formed surface and have bumps formed at the other end thereof.

Because a semiconductor chip of CSP type with superior noise resistance can be obtained when the bump-setting wires are formed from the rewiring layer as mentioned above, a semiconductor device, which uses a chip with many terminals and exhibits excellent noise resistance, can be obtained.

According to a sixth aspect of the semiconductor chip of the present invention, the circuits formed on the circuit-formed surface in the first to fifth problem-solving means mentioned above constitute a radio communication circuit formed by CMOS technology.

The present applicant found out through experiments that radio chips produced by CMOS technology differ greatly in transistor characteristics among individual products than those produced by Si bipolar technology, and the characteristics, such as the dynamic range, tend to deteriorate by the effects of floating capacitances, for example, and that for that matter, the effects are greater when the rewiring layer is formed on the analog circuits. It was confirmed by simulation test that the effects that the rewiring layer placed on the analog circuit has on the radio communication characteristics are 2 to 8 times greater than in the semiconductor chips produced by Si bipolar technology. Therefore, with semiconductor chips in which radio communication circuits are formed on the circuit-formed surface by CMOS technology, by arranging the rewiring layer so as not to be on the analog circuits, it is possible to prevent deterioration in communication characteristics of semiconductor chips of this kind particularly susceptible to the effects of the rewiring layer.

According to a seventh aspect of the semiconductor chip of the present invention, the circuits formed on the circuit-formed surface, mentioned above in the first to sixth problem-solving means, constitute a radio communication circuit for transmitting or receiving or exchanging signals of frequencies of 800 MHz or higher with an external device.

The present applicant found from experiments a fact that the effects that the rewiring layer facing the analog circuit has on the radio communication characteristics depend on frequencies for radio communications and that the communication characteristics rapidly deteriorate when the frequency is 800 MHz or higher. This is considered because of the skin effect that the current flows along the surface course of the rewiring layer at high frequencies of 800 MHz or higher although the current flows near its center when signals of low frequencies of about several MHz are transmitted or received with the current flowing in the rewiring conductor. The effects of the skin effect on the circuits will give rise to an increase of the error rate by noise or a rapid decrease in the transmission distance, or may lead to communication stoppage.

To preclude this problem, in semiconductor chips including a radio communication circuit to transmit or receive or exchange signals of 800 MHz or above, by arranging the rewiring layer in such a manner that it does not overlap the analog circuits, it is possible to prevent the deterioration of the communication characteristics of semiconductor chips of this kind which are particularly susceptible to the effects of the rewiring layer.

Meanwhile, according to a first aspect of the semiconductor device of the present invention, a semiconductor device having a semiconductor chip mounted on a substrate of predetermined dimensions and shape, wherein the semiconductor chip has a rewiring layer formed on a circuit-formed surface through an insulating layer in such a manner as to be integral with the chip, and wherein the rewiring layer and all or a part of the analog circuits formed on the circuit-formed surface are arranged not to overlap each other through the insulating layer.

If a semiconductor chip, having the analog circuits formed on the circuit-formed surface and the rewiring layer are located not to overlap each other as mentioned above, is mounted on the semiconductor device, the analog circuits of the semiconductor chip are not subject to malfunction or deterioration in communication characteristics due to electrostatic induction noise or electromagnetic induction noise, and therefore it is possible to obtain a semiconductor device with excellent communication characteristics.

According to a second aspect of the semiconductor device of the present invention, which has a semiconductor chip mounted on a substrate of predetermined dimensions and shape, wherein the semiconductor chip has a rewiring layer is formed on a circuit-formed surface through an insulating layer in such a manner as to be integral with the chip, and wherein the rewiring layer and at least one of a power circuit, an operational amplifier, a comparison amplifier, an RF receiving part, an RF transmitting part, and an RF synthesizer, formed on the circuit-formed surface, are arranged not to overlap each other through the insulating layer.

If a semiconductor chip is mounted, in which the rewiring layer and at least one of the power circuit, operational amplifier, comparison amplifier, RF receiving part, RF transmitting part, and RF synthesizer, formed on the circuit-formed surface, are arranged so as not to overlap each other through the insulating layer, those circuits most susceptible to the adverse effects of noise are free from malfunction or deterioration in communication characteristics due to electrostatic induction noise or electromagnetic induction noise, and therefore it is possible to obtain a semiconductor device with superb communication characteristics.

According to a third aspect of the semiconductor device of the present invention, which has a semiconductor chip mounted on a substrate of predetermined dimensions and shape, wherein in the semiconductor chip, a rewiring layer is formed on a circuit-formed surface through an insulating layer in such a manner as to be integral with the chip, and wherein a coil formed on the circuit-formed surface and the rewiring layer are arranged not to overlap each other through the insulating layer.

If a semiconductor chip is mounted, in which the coil formed on the circuit-formed surface and the rewiring layer are arranged so that they do not overlap each other as mentioned above, because neither electrostatic induction noise nor electromagnetic induction noise affects the coil highly susceptible to adverse effects of noise, a semiconductor device with outstanding communication characteristics can be obtained.

Other objects, features and advantages of the invention will become apparent from the following description of the embodiments of the invention taken in conjunction with the accompanying drawings.

BEST MODE FOR CARRYING OUT THE INVENTION

First Example of Semiconductor Chip

Figure 1:
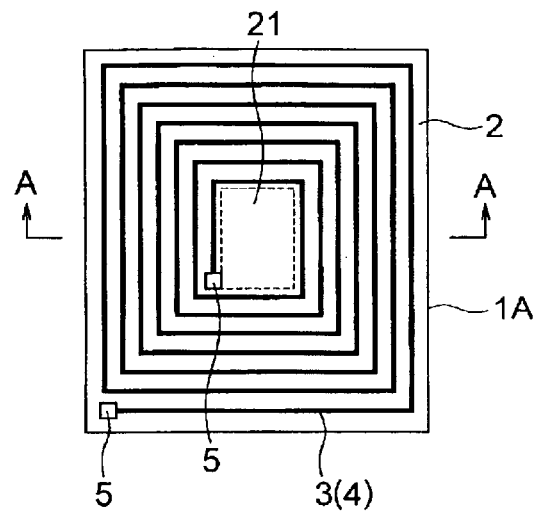
FIG. 1 is a plan view of a semiconductor chip 1A according to a first embodiment of the present invention.

A first example of a semiconductor chip according to the present invention will be described with reference to FIGS. 1 and 2. FIG. 1 is a plan view of a semiconductor chip 1A according to a first embodiment of the present invention, and FIG. 2 is a sectional view taken along the line A—A in FIG. 1.

Figure 2:
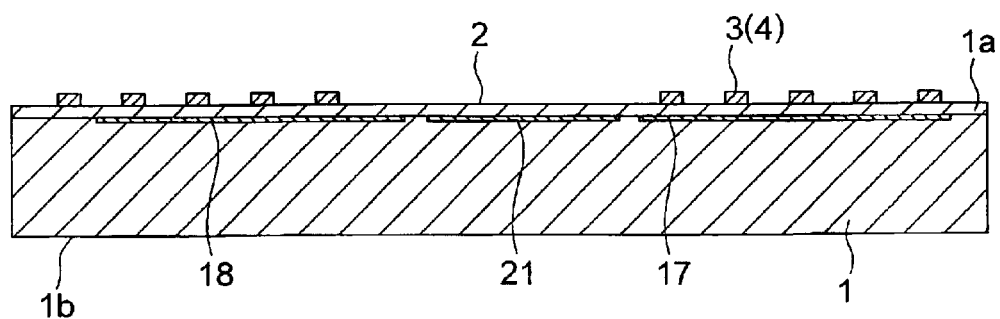
FIG. 2 is a sectional view taken along the line A—A in FIG. 1.

The semiconductor chip 1A in this example is a coil-on-chip type semiconductor chip which, as shown in FIGS. 1 and 2, has a rewiring layer 3 formed on a circuit-formed-surface 1a through an insulating layer 2, and an antenna coil 4 made up of the rewiring layer 3 is formed integral with the chip. In the semiconductor chip of this embodiment, the antenna coil 4 of square-spiral shape is formed in the peripheral area of the circuit-formed surface 1a in a manner to avoid an analog circuit 21 in the center area of the circuit-formed surface 1a.

The analog circuit 21 may be formed by collecting all analog circuits to be formed in the semiconductor chip 1A, or may be one of the particularly noise-susceptible analog circuits, such as the power circuit 11, the operational amplifier 12, the comparison amplifier 13, the RF receiving part 14, the RF transmitting part 15, the RF synthesizer, and a voltage build-up circuit or an amplifier circuit for forming a part of the memory block 18, or may be a coil provided in a part of the analog circuit formed in the semiconductor chip 1A.

The semiconductor chip 1A in this first example is produced by forming the rewiring layer 3, through the insulating layer 2, on the circuit-formed surface 1a in a semiconductor chip as the base (more practically, in a finished wafer before discrete semiconductor chips are cut out of it). For a semiconductor chip as the base of a semiconductor chip 1A in this first example, any well-known semiconductor chip may be used. In order to obtain thinner non-contact type semiconductor devices as final products, it is preferable to use a bare chip of thin thickness achieved by chemical polishing or mechanical polishing or a combination of these carried out on a surface 1b on which circuits are yet to be formed. The thickness is preferably not more than 300 μm, but should preferably be about 50 μm~150 μm for chips applied to thinner cards. It is possible to use chips with a radio communication circuit formed on the circuit-formed surface by CMOS technology or chips which have a radio communication circuit formed on the circuit-formed surface to transmit or receive or exchange signals of frequencies of 800 MHz or higher with an external device.

In the example in FIG. 1, the antenna coil 4 contains several turns of wire but is not limited to this number of turns, and may be a coil of any number of turns, larger than one turn. Also, with regard to the plane figure of the antenna coil 4 as viewed from above, the plane figure is not limited to the example shown in FIGS. 1 and 2. For example, the antenna 4 may be in a shape less liable, by effect of shape, to deterioration in communication characteristics by chamfering the corner portions. The number of turns of the antenna coil 4 may be increased by stacking insulating layers 2 and rewiring layers 3 in a multilayer structure.

In the semiconductor chip 1A in this example, the antenna coil 4 is formed by avoiding the analog circuit 21 in the center area of the circuit-formed surface 1a and by arranging the analog circuit 21 and the antenna coil 4 such that they do not overlap each other, and for this reason, a parasitic capacitance is not formed between the analog circuit 21 and the antenna coil 4, making it possible to prevent the occurrence of electrostatic capacitance noise that affects the analog circuit 21. Because the analog circuit 21 is not face-to-face with the antenna coil 4, it is possible to prevent the occurrence of electromagnetic induction that affects the analog circuit 21. Accordingly, it is possible to prevent crosstalk noise, ringing, power source noise, or the like attributable to the electrostatic induction noise or the electromagnetic induction noise, and also with the coil-on-chip type applicable to high frequencies, it is possible to solve noise-induced malfunction and deterioration in communication characteristics.

When, for a semiconductor chip as the base of the semiconductor chip 1A, a chip having a radio communication circuit formed on the circuit-formed surface by CMOS technology is used, the semiconductor chip of this kind particularly susceptible to the effect of the rewiring layer 3 (the antenna coil 4) can be prevented from deteriorating in communication characteristics. Furthermore, when, for a semiconductor chip as the base of the semiconductor chip 1A, a chip having formed on the circuit-formed surface a radio communication circuit to transmit or receive or exchange signals of frequencies of 800 MHz or higher with an external device, the semiconductor chip of this kind particularly susceptible to the effects of the rewiring layer 3 (the antenna coil 4) can be prevented from deteriorating in communication characteristics.

Second Example of Semiconductor Chip

Figure 3:
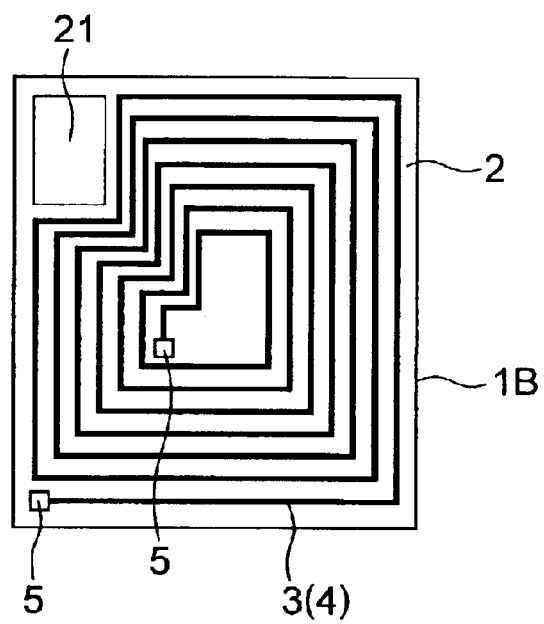
FIG. 3 is a plan view of a semiconductor chip 1B according to a second embodiment.

A second example of the semiconductor chip according to the present invention will be described with reference to FIG. 3. FIG. 3 is a plan view of a semiconductor chip 1B according to a second embodiment.

The semiconductor chip 1B of this example is a coil-on-chip type semiconductor chip, too, and as shown in FIG. 3, a rewiring layer 3 is formed on the circuit-formed surface through an insulating layer 2, and the antenna coil 4 is formed from the rewiring layer 3 in such a manner as to be integral with the chip. In the semiconductor chip 1B of the second example, an antenna coil 4 of atypical spiral shape is formed in the peripheral area of the circuit-formed surface by avoiding the analog circuit 21 provided at one corner of the circuit-formed surface 1a. The other parts of the second embodiment are the same as in the chip 1A of the first embodiment, their descriptions are omitted.

Also in the semiconductor chip 1B of the second embodiment, the antenna coil 4 is formed by avoiding the analog circuit 21 formed in one corner of the circuit-formed surface 1a, and the analog circuit 21 and the antenna coil 4 are arranged in such a manner that they do not overlap each other, and therefore noise can be prevented from acting on the analog circuit 21, so that the same effects as in the semiconductor chip 1A of the first embodiment can be obtained.

Third Example of Semiconductor Chip

Figure 4:
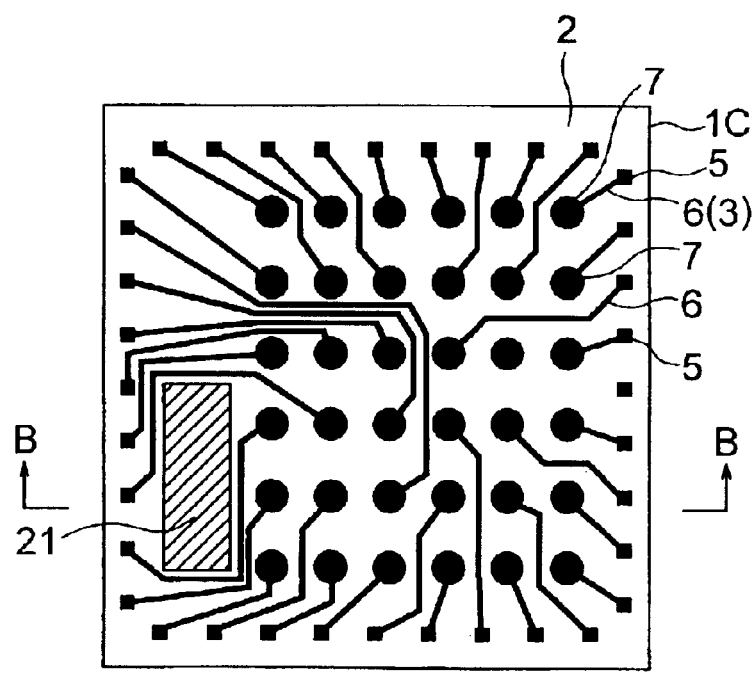
FIG. 4 is a plan view of a semiconductor chip 1C according to a third embodiment.

A third example of the semiconductor chip according to the present invention will be described with reference to FIGS. 4 and 5. FIG. 4 is a plan view of a semiconductor chip 1C according to a third embodiment, and FIG. 5 is a sectional view taken along the line B—B of FIG. 4.

Figure 5:
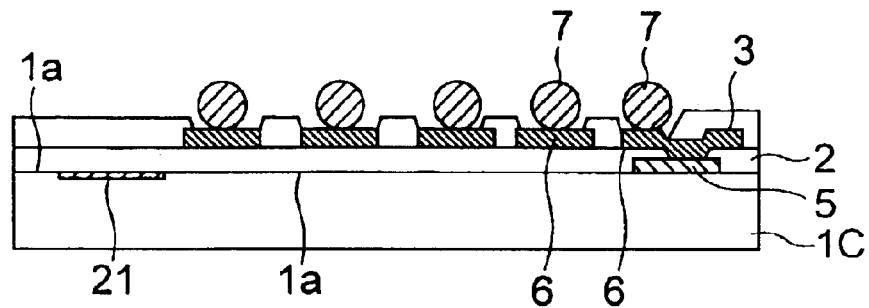
FIG. 5 is a sectional view taken along the line B—B in FIG. 4.

In the semiconductor chip 1C in the third example, which is a CSP type semiconductor chip, as shown in FIGS. 4 and 5, the rewiring layer 3 is formed on the circuit-formed surface 1a through the insulating layer 2, the bump setting wires 6 are formed from the rewiring layer 3, and the bump-setting wires 6 are connected at one end to the input/output terminals 5 and laid out at the other end in the whole surface of the semiconductor chip 1C, and the bumps 7 are formed at the other end of the bump-setting wires. In the semiconductor chip 1C in the third example, the bump-setting wires 6 are laid in the peripheral area in such a manner as to avoid the analog circuit 21 formed in a part of the circuit-formed surface, and the bumps 7 are arranged only in the side area adjacent to the boundary of the area where the analog circuit 21 is formed. The other parts of the third embodiment are the same as in the semiconductor chip 1A of the first embodiment, their descriptions are omitted.

Also in the semiconductor chip 1C of the third example, the bump-setting wires 6 and the bumps 7 are formed by avoiding the analog circuit 21 formed in a part of the circuit-formed surface 1a and the analog circuit 21 is formed so as not to overlap the bump-setting wires 6 and the bumps 7.

Therefore, noise is prevented from affecting the analog circuit 21, and the same effects as in the semiconductor chip 1A in the first embodiment described above can be obtained.

Fourth Example of Semiconductor Chip

Figure 6:
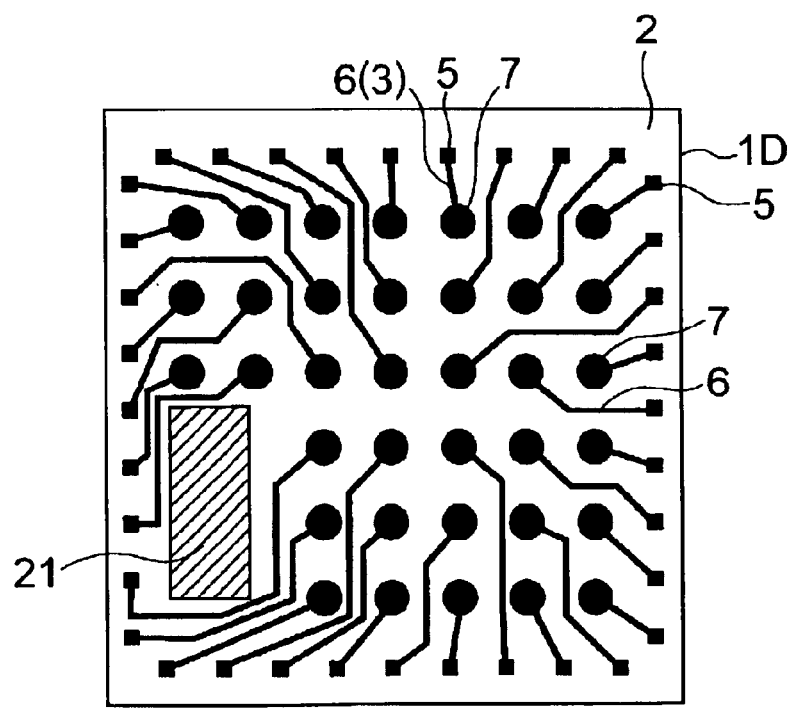
FIG. 6 is a plan view of a semiconductor chip 1D according to a fourth embodiment.

A fourth example of the semiconductor chip according to the present invention will be described with reference to FIG. 6. FIG. 6 is a plan view of a semiconductor chip 1D according to the fourth embodiment.

In the semiconductor chip 1D in the first example, which is a CSP type too, as shown in FIG. 6, the rewiring layer 3 is formed on the circuit-formed surface 1a through the insulating layer 2, and the bump-setting wires 6 are formed from the rewiring layer 3, and are connected at one end to the input/output terminals 5 and laid out at the other end in the whole surface of the semiconductor chip 1D, and the bumps 7 are formed at the other end of the bump-setting wires 6. In the semiconductor chip 1D of the fourth example, the bump-setting wires 6 are laid in the peripheral area of the circuit-formed surface 1a by avoiding the analog circuit 21 in a part of the circuit-formed surface 1a, and the bumps 7 are arranged in the upper area or the side area adjacent to the boundary of the area where the analog circuit 21 is formed. The other parts are the same as in the semiconductor chip 1C of the third embodiment and therefore their descriptions are omitted.

Also in the semiconductor chip 1C, the bump-setting wires 6 and the bumps 7 are formed in such a manner as to avoid the analog circuit 21 in a part of the circuit-formed surface 1a, and the analog circuit 21 and the bump-setting wires 6 and the bumps 7 are arranged not to overlap each other, for which reason the same effects as in the semiconductor chip 1C of the third embodiment can be obtained.

Fifth Example of Semiconductor Chip

Figure 7:
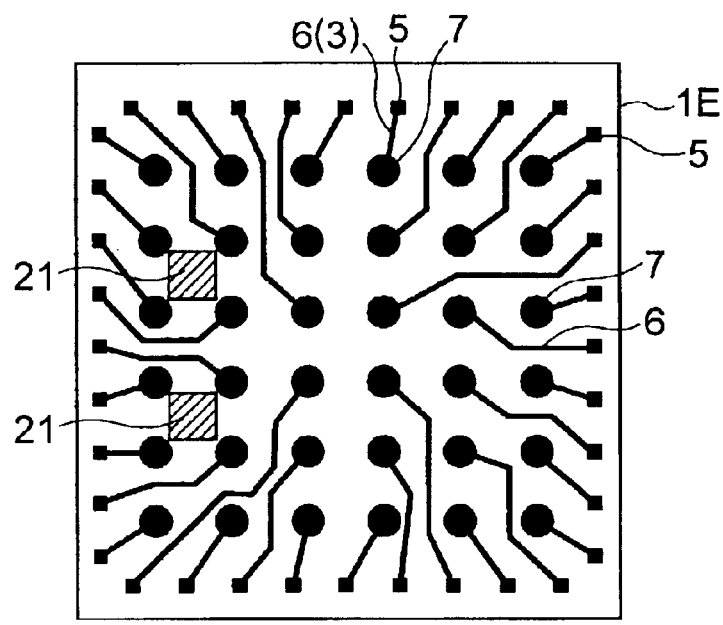
FIG. 7 is a plan view of a semiconductor chip 1E according to a fifth embodiment.

A fifth example of the semiconductor chip according to the present invention will be described with reference to FIG. 7. FIG. 7 is a plan view of a semiconductor chip 1E according to the fifth embodiment.

In the semiconductor chip 1E in this example, which is a CSP type too, and as shown in FIG. 7, the rewiring layer 3 is formed on the circuit-formed surface 1a through the insulating layer 2, the bump-setting wires 6 are formed from the rewiring layer 3 and are connected at one end to the input/output terminals 5 and laid out at the other end in the whole surface of the semiconductor chip 1E, and the bumps 7 are formed at the other end of the bump-setting wires 6. In the semiconductor chip 1E in this example, the bump-setting wires 6 are laid in the peripheral area of the circuit-formed surface 1a by avoiding the analog circuits 21 formed in two places on the circuit-formed surface 1a, and the bumps 7 are arranged in the areas adjacent to the four sides of each of the two analog circuits 21. The other parts are the same as in the semiconductor chip 1C according to the third embodiment and therefore their descriptions are omitted.

Also in the semiconductor chip 1E of this example, the bump-setting wires 6 and the bumps 7 are formed by avoiding the analog circuits formed in some part of the circuit-formed surface 1a, and the analog circuits 21 are arranged not to overlap the bump-setting wires 6, for which reason the same effects as in the semiconductor chip 1C of the third embodiment can be obtained.

First Example of Method for Forming the Rewiring Layer

Figure 8:
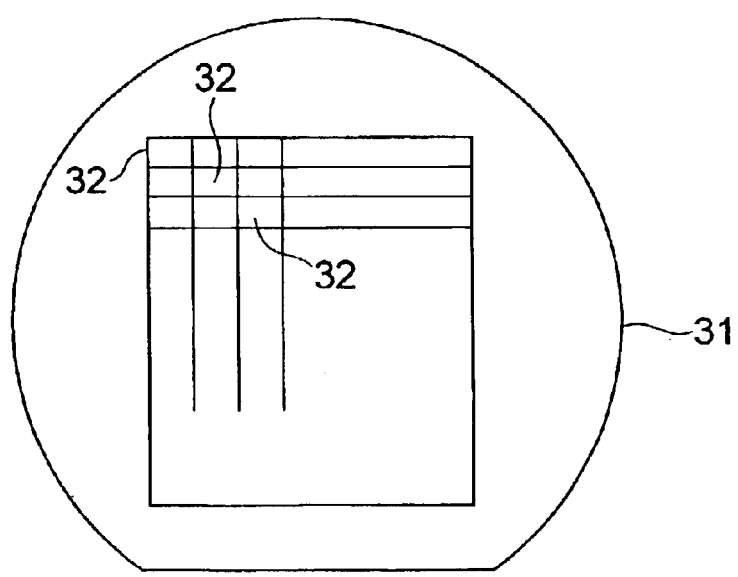
FIG. 8 is plan view a finished wafer by a specified process.

A first example of a method for forming the rewiring layer 3 that makes up the antenna coil 4 or the bump-setting wires 6 will be described with reference to FIGS. 8 to 10. FIG. 8 is a plan view of a so-called finished wafer that has gone through a specified process; FIG. 9 is a diagrammatic presentation of the process steps to show a first example of a method for forming the rewiring layer 3; and FIG. 10 is a plan view of a finished wafer on which the rewiring layers have been formed.

As shown in FIG. 8, on the finished wafer 31, circuits 32 for a large number of semiconductor chips are formed equally spaced in the inner area of the wafer, exclusive of the outermost peripheral area, and a necessary surface-protective film 33 (see FIG. 9) is formed on the circuit-formed surface.

Figure 9A:
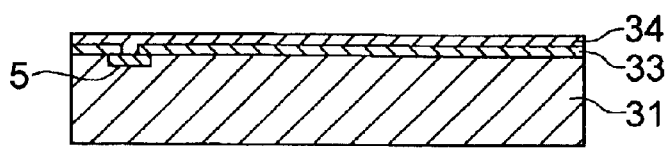
FIGS. 9A, 9B, 9C, 9D, 9E and 9F show process steps of a first example of a method for forming a rewiring layer.
Figure 9B:
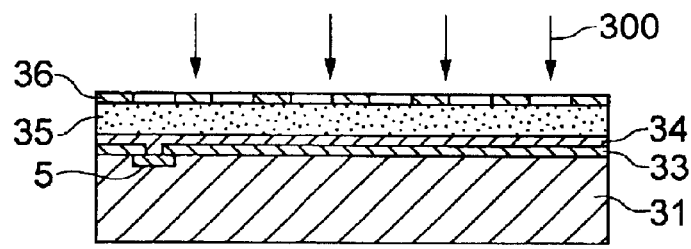
Figure 9C:
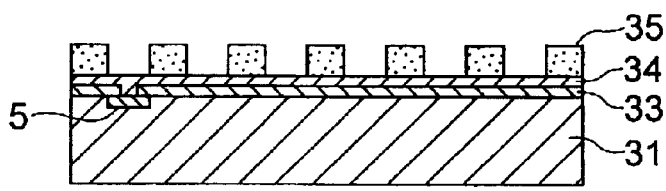
Figure 9D:
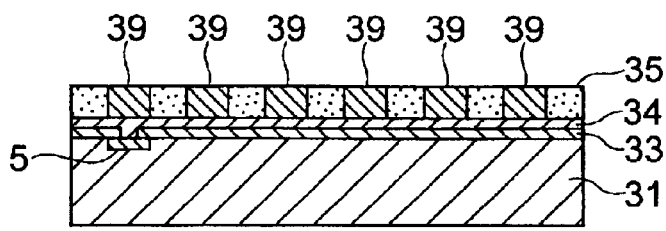
Figure 9E:
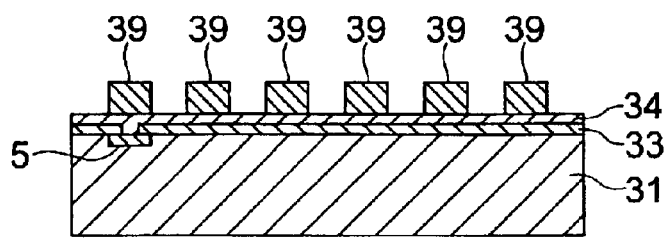
Figure 9F:
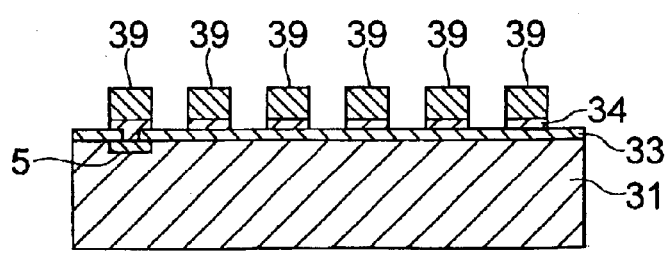
Figure 10:
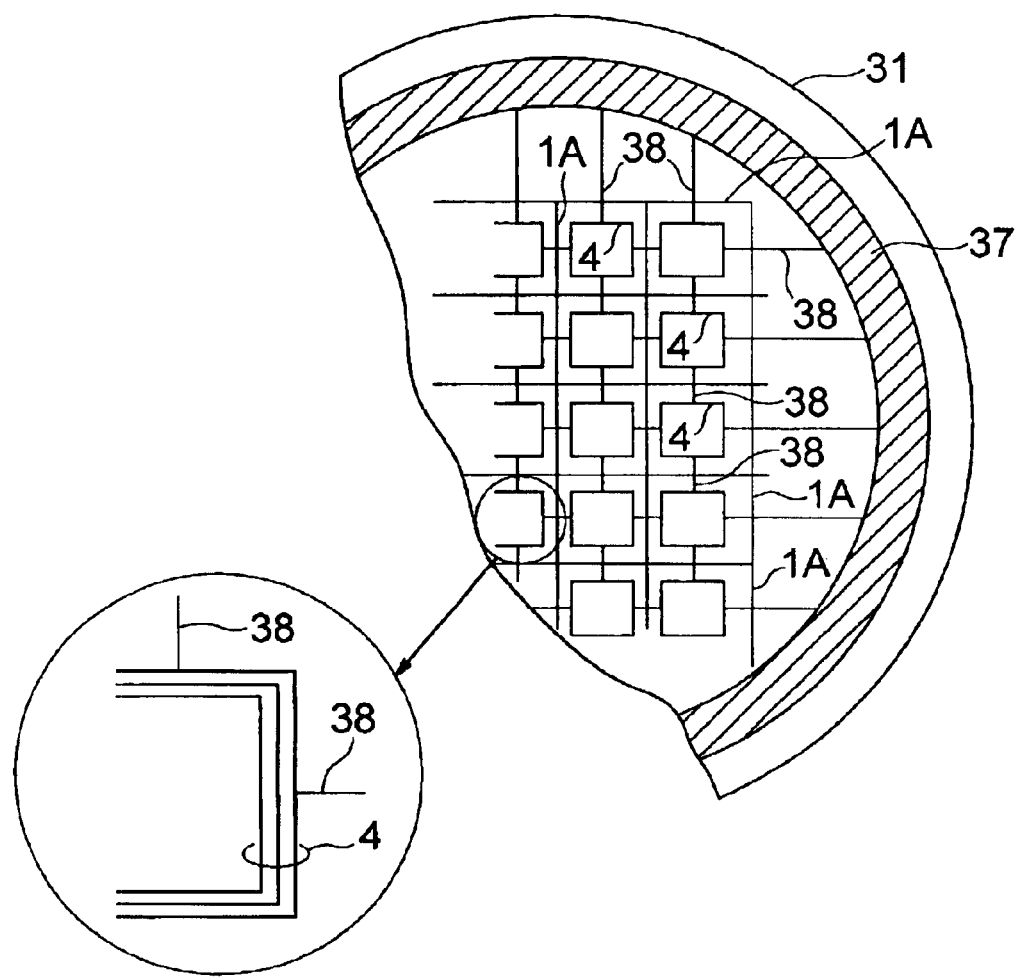
FIG. 10 is a plan view of a finished wafer on which a rewiring layer was completed.

In the first example of the method for forming a rewiring layer shown in FIGS. 9(A), 9(B), 9(C), 9(D), 9(E) and 9(F), as shown in FIG. 9(A), a metal-sputtered layer or a metal-vapor deposited layer 34 is uniformly formed by using aluminum or an aluminum alloy or copper or a copper alloy on the surface-protective layer 33 formed on the circuit-formed surface of a finished wafer 31. Then, as shown in FIG. 9(B), a photoresist layer 35 is formed uniformly on the metal-sputtered layer or the metal-vapor deposited layer 34, the formed photoresist layer 35 is covered with a mask having formed therein a required pattern including antenna coils 4 or bump-setting wires 6, and the photorsist layer 35 is exposed through the mask 36 to light 300 of a predetermined wavelength which is supplied from the outside of the mask 36. Subsequently, the exposed photoresist layer 35 goes through an exposure process, and as shown in FIG. 9(C), the exposed regions of the photoresist layer 35 are removed, and those regions of the metal-sputtered layer or the metal-vapor deposited layer 34 which correspond to the exposure pattern are exposed to light. As shown in FIG. 10, the exposure pattern for the metal-sputtered layer or the metal-vapor deposited layer 34 includes a ring-shaped electrode 37, the antenna coils 4 or the bump-setting wires 6 formed on the circuit-formed areas excepting the analog-circuit areas 21, and the leads 38 connecting the electrode 37 to the antenna coils 4 or the bump-setting wires 6. By using the electrode 37 as one electrode, electroplating or precision electrocoating is carried out on the exposed regions of the metal-sputtered layer or the metal-vapor deposited layer 34, and a metal plated layer is deposited on the exposed regions of the metal-sputtered layer or the metal-vapor deposited layer 34 as shown in FIG. 9(D). After this, the photoresist layer 35 attached to the surface of the finished wafer 31 is removed by a process, such as an ashing process, and as shown in FIG. 9(E), a finished wafer is obtained having the metal plated layer 39, which includes the electrode 37, the antenna coils 4, the bump-setting wires 6, and the leads 38, formed on the uniform metal-sputtered layer or the metal-vapor deposited layer 34. Subsequently, by selectively etching the metal-sputtered layer or the metal-vapor deposited layer 34 exposed through the metal plated layer 39 as shown in FIG. 9(F). Thus, the finished wafer 31, which has had the metal-sputtered layer or the metal-vapor deposited layer 34 and the metal plated layer 39 formed, is obtained as shown in FIG. 9(F). Finally, by scribing the finished wafer 31, semiconductor chip IC elements 1A to 1E are obtained.

Note that, in this example, electroplting or precision electrocasting is used as means for forming the metal plated layer 39. In place of the configuration described above, the metal plated layer 39 may be formed by electroless plating. In this case, there is no need to prepare an electrode to form the metal plated layer and therefore for exposure of the photoresist layer 35, it is not necessary to form the electrode 37 and the leads 38.

Electroless plating is also referred to as chemical plating, in which the base metal is immersed in a metallic salt solution of a plating metal to cause metal ions to precipitate out on the surface of the base metal. The electroless plating is characterized in that a plated layer with high adhesion strength and a uniform and sufficient thickness can be obtained with relatively simple equipment. The metallic salt serves as a source to supply metal ions for plating, and when copper plating is performed, a plating solution of copper sulfate, cupric chloride or copper nitrate is used. Metal ions, such as copper ions, precipitate out only on a metal-sputtered layer or a metal-vapor deposited layer 34 as the base metal, but do not precipitate on the surface-protective layer 33 of insulating property. The base material is required to have a smaller tendency to ionize than the plating-metal ions and also have a catalytic action to the precipitation of the plating-metal ions. Therefore, to plate the metal-sputtered layer or the metal-vapor deposited layer 6 of aluminum with copper, it is preferable to form nickel to a thickness of not more than several μm on the surface of the aluminum layer and perform pretreatment to substitute with zinc by dipping the wafer in a copper nitrate solution for a few seconds.

On the other hand, in electroplating and precision electrocasting, the finished wafer 31, which has had the metal-sputtered layer or the metal-vapor deposited layer 34 formed thereon, and the electrode, made up of the plating metal, are both immersed in a plating bath, containing the ions of the plating metal, and a voltage is applied between the metal-sputtered layer or the metal-vapor deposited layer 34, as the cathode, formed on the finished wafer 31 and the electrode immersed in the plating math as the anode, so that the metal ions in the plating bath precipitate on the surface of the metal-sputtered layer or the metal-vapor deposited layer 34. Both in the electroplating or precision electrocasting, when copper is to be plated, a solution of copper sulfate or cupric chloride or copper nitrate is used as the electrolytic solution.

The method for forming the rewiring layer 3 in this example is formed such that on the finished wafer 31, a required conductive pattern is formed, including the required antenna coils 4 or bump-setting wires 6, and after this, required semiconductor chips 1A to 1E are obtained by scribing the finished wafer 31. Compared with a case where the antenna coil 4 or the bump-setting wires 6 are formed on each semiconductor chip, this method makes it possible to manufacture semiconductor chips of coil-on-chip type or CSP type with higher efficiency and therefore at a reduced production cost. Moreover, the antenna coils 4 or bump-setting wires 6 with uniform thickness are formed with high precision on all semiconductor chips on the wafer 31, thus contributing to a reduction of variations in communication characteristics. In addition, if the antenna coil 4 or the bump-setting wires 6 are formed by sputtering or vacuum deposition and plating carried out on each of semiconductor chips 1A to 1E, unwanted conductors adhere to the peripheral areas of the semiconductor chips 1A to 1E, which gives rise to a problem of insulating properties of the semiconductor chips. In contrast, when a required conductive pattern, including the antenna coils 4 or the bump-setting wires 6, is formed on a finished wafer 31, even if unnecessary conductive substances adhere to the peripheral part of the wafer 31 during sputtering, for example, that peripheral part is primarily unnecessary and must be discarded, and there are no adverse effects that that part may have on the insulating properties of the discrete semiconductor chips 1A to 1E. Moreover, according to the method for forming the rewiring layer 3 in this example, the metal plated layer 39 is formed while the photoresist layer 35 is in place, and subsequently those portions of the metal-sputtered layer or the metal-vapor deposited layer 34 which are not deposited by the metal plated layer 39 are removed by etching, and as shown in FIG. 9E, the metal plated layer 39 is deposited only on the top surface of the metal-sputtered layer or the metal-vapor deposited layer 34 and does not become wider in the width direction, so that the antenna coil or bump-setting wires 6 can be formed with high precision and an antenna coil of a large number of turns or a large number of bump-setting wires 6 can be formed.

Second Example of Method of Forming the Rewiring Layer

A second example of a method for forming the rewiring layer 3 will be described with reference to FIGS. 11A, 11B, 11C, 11D, and 11E. FIGS. 11A, 11B, 11C, 11D, and 11E are process steps showing the second example of the method for forming the rewiring layer 3.

Figure 11A:
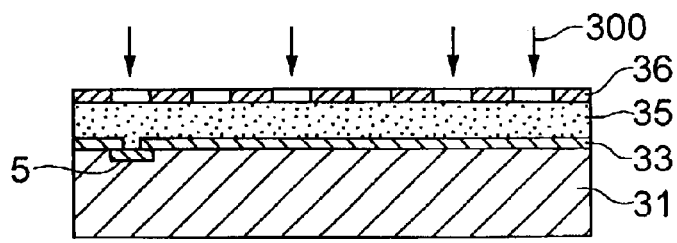
FIGS. 11A, 11B, 11C, 11D and 11E show process steps of a second example of a method for forming the rewiring layer.
Figure 11B:
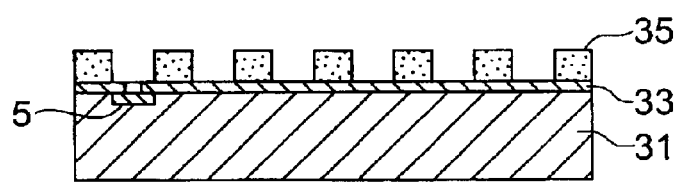
Figure 11C:
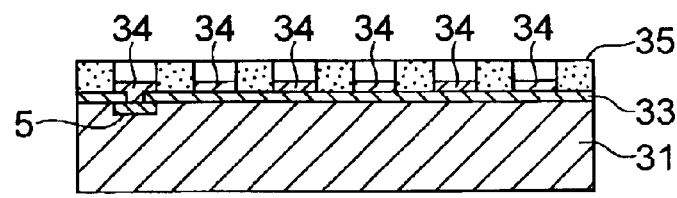
Figure 11D:
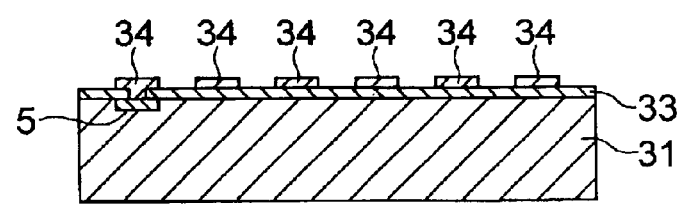
Figure 11E:
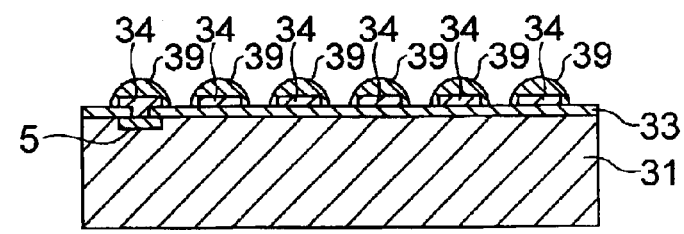

According to the method for forming the rewiring layer 3 of this example, as shown in FIG. 11(A), the photoresist layer 35 is formed uniformly on the surface-protective layer 33 formed on the finished wafer 31, the photoresist layer 35 thus formed is covered with a mask 36 having formed therein a required pattern, including the antenna coil 4 or the bump-setting wires 6, and the photoresist layer 35 is exposed to light 300 of a predetermined wavelength, which is incident onto the mask 36 from outside. After this, the exposed photoresist layer undergoes an exposure process, and as shown in FIG. 11(B), the exposed portions of the photoresist layer 35 are removed, with the result that the parts of the surface-protective film 33 which correspond to the exposure pattern are laid bare. As shown in FIG. 10, the exposure pattern of the photoresist layer 35 may have a shape that includes the electrode 37, the antenna coils 4 or the bump-setting wires and the leads 38 formed in the surface excepting the analog circuit 21. Then, the finished wafer 31 after the exposure process is mounted on a sputtering unit or a vacuum deposition unit, and as shown in FIG. 11(C), a metal-sputtered layer or a metal-vapor deposited layer 34 is formed in the exposed regions of the surface-protective film 33. Subsequently, as shown in FIG. 11(D), the photoresist layer 35 attached to the finished wafer 31 is removed by an ashing process, then the metal-sputtered layer or the metal-vapor deposited layer 34 is electroplated by using the electrode 37 as the electrode on one side, and a metal plated layer 39 is deposited on the exposed parts of the metal-sputtered layer or the metal-vapor deposited layer 34 as shown in FIG. 11(E). Finally, the required semiconductor chip IC elements 1A to 1E shown in FIGS. 1 to 7 are obtained by scribing the finished wafer 31.

Note that also in the method for forming the rewiring layer 3 of this example, electroplating is used as means for forming the metal plated layer 39, but in place of this configuration, the metal plated layer 39 may be formed by electroless plating. In this case, there is no need to use the electrode to form the metal plated layer 39; therefore, for exposure of the photoresist layer 35, it is not necessary to form the electrode 37 and the leads 38.

This method for forming the rewiring layer 3 in this example offers the same effects as in the method for forming the rewiring layer 3 in the first example, and can reduce the number of processes for forming the conductive pattern on the finished wafer 31, and therefore this method makes it possible to produce semiconductor chips of coil-on-chip type and CSP type with high efficiency.

First Example of Semiconductor Device

Figure 12:
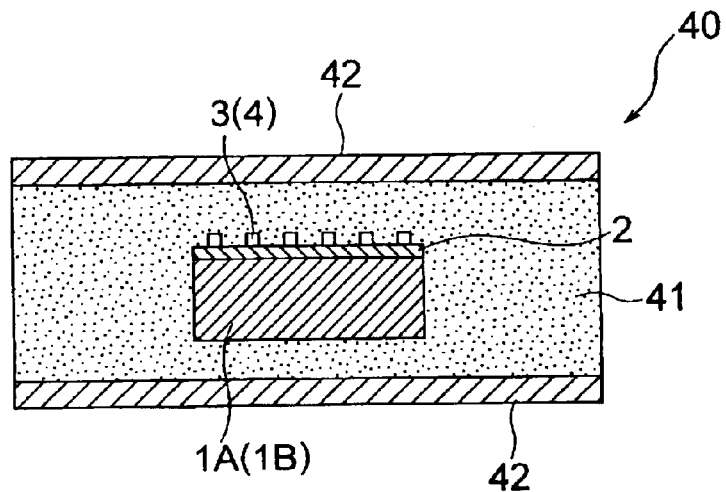
FIG. 12 is a sectional view of a semiconductor device according to a first embodiment of the present invention.

A first example of the semiconductor device according to the present invention will be described with reference to FIG. 12. FIG. 12 is a sectional view of a semiconductor device 40 according to a first embodiment of the present invention.

As shown in FIG. 12, the semiconductor device 40 according to the first embodiment is characterized in that the coil-on-chip type semiconductor chip 1A or 1B is encapsulated in a substrate consisting of an adhesive layer 41 and two pieces of cover sheet. As an adhesive that constitutes the adhesive layer 41, any adhesive well known in the art may be used as long as it has required adhesion strength, but a hot-melt adhesive should preferably be used, being superior in mass production aptitude. As the cover sheet 42, any sheet material well known in the art may be used as long as it has required strength and printability. However, it is particularly preferable to use high polymer sheet, such as polyethylene terephthalate which produces less of harmful substances when burnt. The semiconductor device 40 in this example can be formed by fixing a semiconductor chip 1A or 1B on one adhesive layer 41 of a first cover sheet, which has this one adhesive layer 41 formed on one surface thereof, and then by attaching the other adhesive layer 41 of a second cover sheet, which has this other adhesive layer 41 formed on one surface thereof, to the bonding surface of the first cover sheet 42.

In the semiconductor device 40 of this example, because a semiconductor chip 1A or 1B is mounted, which has the analog circuit 21 and the antenna coil 4 arranged not to overlap each other, a parasitic capacitance is not formed between the analog circuit 21 and the antenna coil 4, a fact which eliminates occurrence of electrostatic induction noise that affects the analog circuit 21. Furthermore, because the analog circuit 21 and the antenna coil 4 are arranged not to be face-to-face with each other, it is possible to prevent occurrence of electromagnetic induction noise that affects the analog circuit 21. Therefore, crosstalk noise, ringing, power source noise, or the like can be prevented which are attributable to the electrostatic induction noise and the electromagnetic induction noise, thereby improving the communication characteristics of a non-contact semiconductor device in which a coil-on-chip type semiconductor chip 1A or 1B is mounted. Moreover, because such semiconductor devices can be manufactured simply by encapsulating a required semiconductor chip 1A or 1B between two cover sheets 42, they can be manufactured in micromini sizes and at reduced cost.

Second Example of Semiconductor Device

Figure 13:
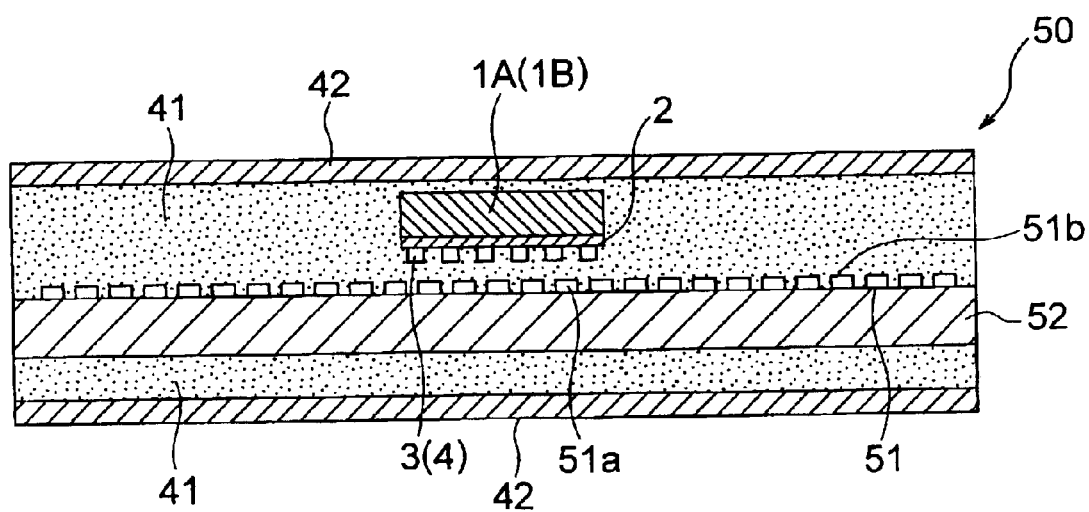
FIG. 13 is a sectional view of a semiconductor device according to a second embodiment.

A second example of the semiconductor device according to the present invention will be described with reference to FIGS. 13 and 14. FIG. 13 is a sectional view of a semiconductor device according to a second embodiment, and FIG. 14 is a plan view of a booster coil to be mounted on the semiconductor device according to the second embodiment.

As shown in FIG. 13, a semiconductor device 50 according to the second embodiment is characterized by encapsulation of the coil-on-chip type semiconductor chip 1A or 1B and a insulating substrate 52 consisting of the adhesive layer 41 and the cover sheets 42 in the substrate, the insulating substrate 52 having formed thereon a booster coil 51 for strengthening electromagnetic coupling between the antenna coil 4 formed integral with the semiconductor chip 1A or 1B and an antenna coil of the reader/writer, not shown.

Figure 14:
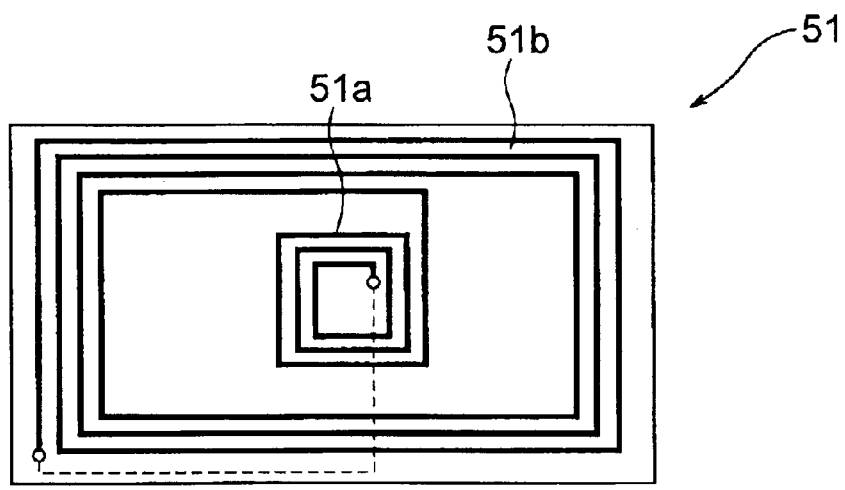
FIG. 14 is a plan view of a booster coil mounted on a semiconductor device according to a second embodiment.

As shown in FIG. 14, the booster coil 51 consists of a first coil 51a with a smaller diameter of turns and a second coil 51b with a larger diameter of turns, and the two coils are electrically connected. The first coil 51a is a coil mainly electromagnetically coupled with the antenna coil 4 formed integral with the semiconductor chip 1A or 1B, and its plane figure and size are formed to be the same or similar to those of the antenna coil 4 formed integral with the semiconductor chip 1A or 1B. On the other hand, the second coil 51b is a coil chiefly electromagnetically coupled with the antenna coil on the reader/writer, and its plane figure and size are formed to the greatest possible extent as long as they can be accommodated in the substrate composed of the adhesive layer 41 and the cover sheets 42. In the example of FIG. 14, both the first coil 51a and the second coil 51b are formed in a rectangular spiral form with a plurality of turns. The coils 51a and 51b are not limited to the number of turns and the plane figure shown in FIG. 14, but may be formed arbitrarily. The booster coil 51 can be formed by an etching method for applying etching to a conductive metal layer with a uniform thickness formed on one surface of the insulating substrate 52 to form a required coil pattern or by a printing method for printing a required pattern with a conductive ink on the one surface of the insulating substrate 52.

Incidentally, the kind or an adhesive constituting the adhesive layer 41 or the kind of a sheet material constituting the cover sheets 42 are the same as in the semiconductor device 40 in the first embodiment, and their descriptions are omitted to avoid repetition.

The semiconductor device 50 in this example has the same effects as the semiconductor device 40 in the first embodiment, and the provision of the booster coil adds another effect of reinforcing the electromagnetic coupling between the antenna coil 4 formed integral with the semiconductor chip 1A or 1B and the antenna coil of the reader/writer, not shown.

Third Example of Semiconductor Device

Figure 15:
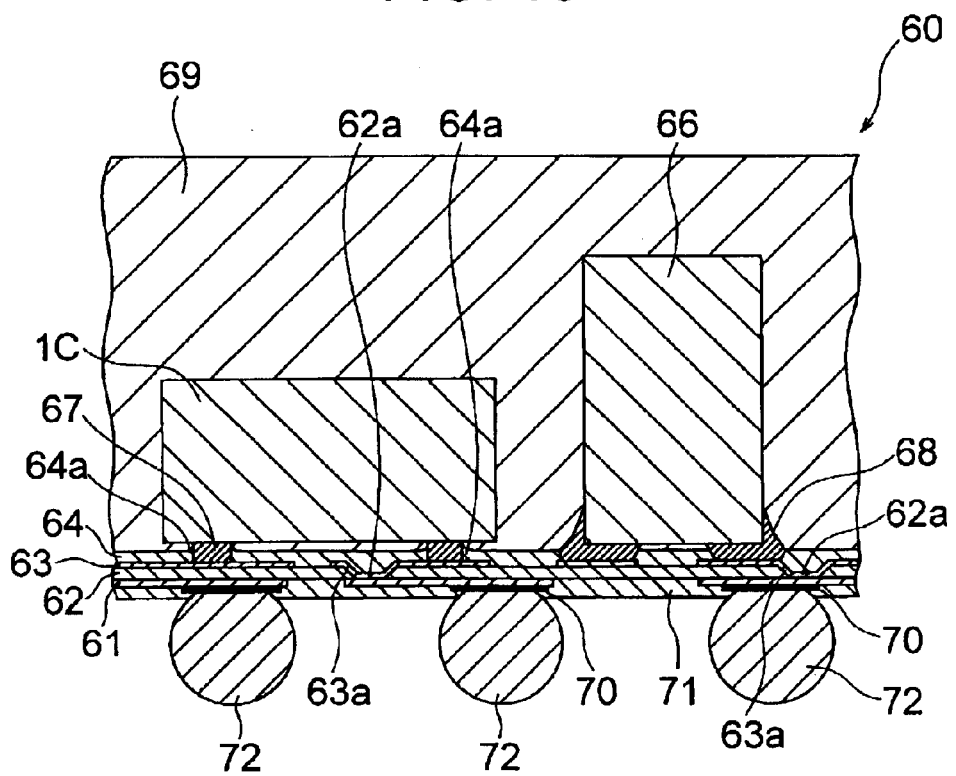
FIG. 15 is a sectional view showing a principal portion of a semiconductor device according to a third embodiment.
Figure 16:
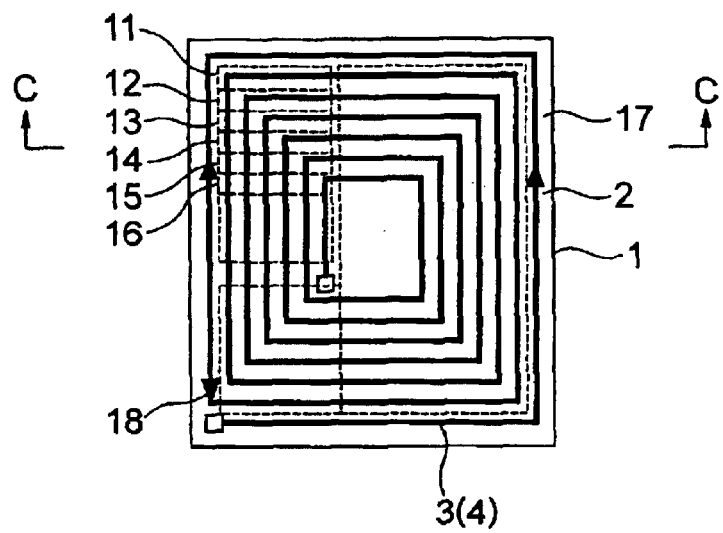
FIG. 16 is a plan view of a semiconductor chip of a conventional coil-on-chip type.
Figure 17:
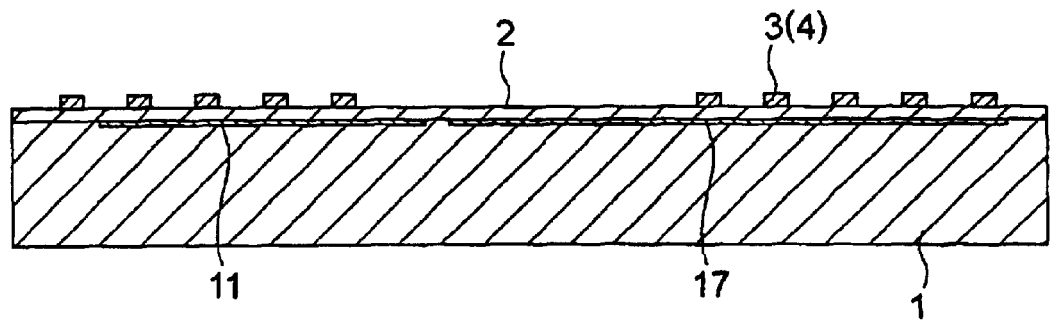
FIG. 17 is a sectional view of a semiconductor chip of a conventional coil-on-chip type.
Figure 18:
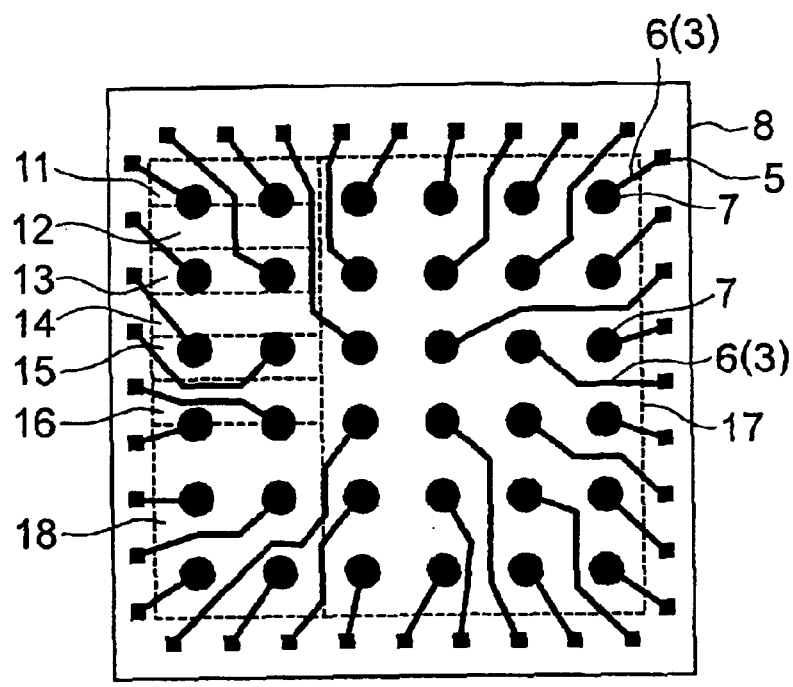
FIG. 18 is a plan view of a semiconductor chip of a conventional CSP type.
Figure 19:
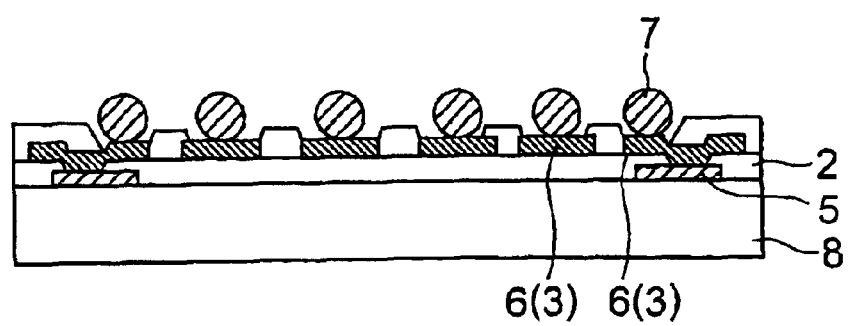
FIG. 19 is a sectional view of a semiconductor chip of a conventional CSP type.
Figure 20:
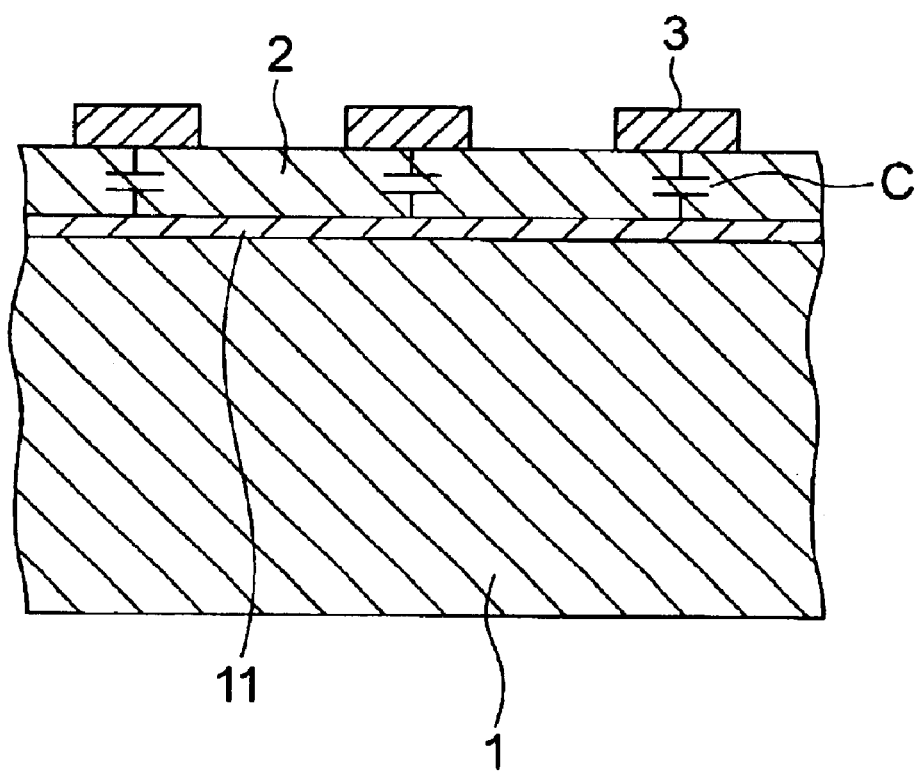
FIG. 20 is an explanatory diagram of parasitic capacitances formed between the circuit portion and the antenna coil of a semiconductor chip.

A second example of the semiconductor device according to the present invention will be described with reference to FIG. 15. FIG. 15 is a sectional view of an essential portion of the semiconductor device according to a third embodiment of the present invention.

As shown in FIG. 15, a semiconductor device 60 according to the third embodiment comprises a first wiring layer 61, a first insulating layer 62, a second wiring layer 63, a junction to connect the first wiring layer 61 and the second wiring layer 63, a second insulating layer 64, a semiconductor chip 1C, another mounted part 66, a conductor 67 to connect the second wiring layer 63 to the semiconductor chip 1C, a conductor 68 to connect the second wiring layer 63 to the one other mounted part 66, a molding resin 69 for encapsulating the semiconductor chip 1C, the one other mounted part 66, and the conductors 67, 68 in one body, a nickel layer (metal film) 70 formed locally on the outer surface of the first wiring layer 61, a protective resin layer 71 covering the outer surface of the first wiring layer 61, and external terminals 72 formed on the nickel layer.

The first wiring layer 61, the second wiring layer 63, and the junctions 63a are formed by electroplating (electrocasting) using copper or a copper alloy. As a copper alloy for this purpose, a copper-nickel alloy or a copper-nickel-silver alloy is particularly suitable, being superior in corrosion resistance and bond strength. A junction 63a is formed in each of first openings 62a provided in the first insulating layer 62, and electrically connects the first wiring layer 61 with the second wiring layer 63.

The first insulating layer 62, the second insulating layer 64, and the protective resin layer 71 are formed by an insulating resin. For the insulating resin, a photosensitive resin may be used to facilitate the formation of the first insulating layer 62, the second insulating layer 64, and the protective resin layer 71. In the first insulating layer 62, the first openings 62a for forming the junctions 63a are formed in a required array, and in the second insulating layer 64, second openings 64a that have the conductors 67, 68 pass through are formed in a required array.

As the other mounted part 66, a chip part, such as a transistor, a diode, a resistor, an inductor, a capacitor, a quartz oscillator, a filter, a balun, an antenna, and a function module, and an external link connector can be mounted. The function module contains a VCO, a PLL or a power regulator, or the like.

As the conductor 68 for connecting the other mounted part 66 with the second wiring layer 63, a conductive paste or an anisotropic conductive adhesive may be used, but solder is most suitable, being less expensive and highly reliable.

The molding resin 69 is used as a resin for sealing the semiconductor chip 1C, another mounted part 66, and the conductive parts connecting the mounted parts 1C and 66 to the second wiring layer 63 by a resin in a monolithic package, and for this purpose, any of the various kinds of resin materials, which have been used for resin-sealing of semiconductor chips, can be used.

The nickel layer 70 serves to facilitate the formation of the external terminals 72 and is formed at the terminal portions of the first wiring layer 61, on which the external terminals 72 are to be formed.

The external terminals 72 are used to connect the semiconductor device 60 according to this embodiment to an external device, such as a printed circuit board, and the external terminals 72 are preferably formed by solder because solder is suitable for obtaining reliable connections at low cost.

The semiconductor device 60 in this example has the same effects as the semiconductor device 40, and in the semiconductor chip 60, because the mounted parts 1C and 66 are connected by the wiring means, such as the wiring layers 61 and 63 and the protective resin layers 62 and 64, a part corresponding to the core material of the conventional multilayered substrate need not be provided, and therefore a thin-thickness less-expensive semiconductor device can be obtained. Moreover, because the wiring layers 61 and 63 are used, compared with a case where a substrate is used which has a lead frame or a wiring layer formed by metal-foil etching or conductive-paste printing, the wiring pattern can be produced with higher component density, higher precision, smaller size and improved homogenization, and a semiconductor module reduced in size and highly adapted to high frequencies can be obtained. Furthermore, because the first wiring layer 61 and the second wiring layer 63, which are electrically connected with each other, are formed in a two-layer structure, the area required for forming the wiring layers 61 and 63 can be reduced, to thereby decrease the semiconductor device to a smaller size.

In the above-mentioned embodiment, the wiring layer is formed as a two-layer structure but, obviously, may be formed as a not-less-than-three-layer structure. In the above-mentioned embodiment, the CSP type semiconductor chip 1C is used, but another CSP type semiconductor chip, such as 1D or 1E, can be used.

INDUSTRIAL APPLICABILITY

According to the invention, the analog circuit formed on the circuit-formed surface of the semiconductor chip and the rewiring layer are arranged not to overlap each other through an insulating layer; therefore, a parasitic capacitance is not formed between the analog circuit and the rewiring circuit, thereby eliminating the occurrence of electrostatic induction noise that affects the analog circuit. Moreover, because the analog circuit is not arranged face-to-face with the rewiring layer, electromagnetic induction noise is prevented from occurring that affects the analog circuit. Therefore, crosstalk noise, ringing, and power source noise, for example, ascribable to the electrostatic induction noise or electromagnetic induction noise can be prevented, and also with a semiconductor chip of rewiring layer-integral type adapted to high frequencies, malfunction or deterioration in communication characteristics ascribable to noise can be eliminated.

According to the invention, the rewiring layer and at least one of the particularly noise-susceptible analog circuits formed on the circuit-formed surface, such as the power circuit, operational amplifier, comparison amplifier, RF receiving part, RF transmitting part, and RF synthesizer, are arranged not to overlap each other through an insulating layer, with each of such circuits, crosstalk noise, ringing, power noise or the like ascribable to electrostatic induction noise or electromagnetic induction noise can be prevented, making it possible to eliminate malfunction and deterioration in communication characteristics due to noise.

According to the invention, among the analog circuits formed on the circuit-formed surface, the coil particularly susceptible to noise and the rewiring layer are arranged not to overlap each other through an insulating layer, making it hard for electrostatic induction noise or electromagnetic induction noise to act on the coil, and thus eliminating malfunction and deterioration in communication characteristics, which may be induced by noise.

According to the invention, because the antenna coil for non-contact communication is formed from the rewiring layer, it becomes possible to obtain a coil-on-chip type semiconductor chip superior in noise resistance, thereby making it possible to manufacture a non-contact type semiconductor device with excellent noise resistance at low cost.

According to the invention, because the bump-setting wires are formed from the rewiring layer, a CSP type semiconductor chip with excellent noise resistance can be obtained, and a semiconductor device using a chip with many terminals and exhibiting excellent noise resistance can be obtained.

According to the invention, in a semiconductor chip which has a radio transmission circuit formed on the circuit-formed surface by CMOS technology, the rewiring layer is arranged so as not to be on the analog circuit, for which reason semiconductor chips of this kind particularly susceptible to the effect of the rewiring can be prevented from deteriorating in the communication characteristics.

According to the invention, in a semiconductor chip which has formed thereon a radio communication circuit for transmitting, receiving or exchanging signals of frequencies of 800 MHz or higher with an external device, the rewiring layer is arranged not to be on the analog circuit, for which reason semiconductor chips of this kind particularly susceptible to the effect of the rewiring layer are prevented from deteriorating in the communication characteristics.

According to the invention, a semiconductor chip, in which the analog circuit on the circuit-formed surface and the rewiring layer are arranged not to overlap each other through an insulating layer, for which reason it is possible to obtain a semiconductor device, in which the analog circuit of the semiconductor chip is less liable to suffer malfunction and deterioration in communication characteristics attributable to electrostatic induction noise or electromagnetic induction noise, and which therefore exhibits excellent communication characteristics.

According to the invention, a semiconductor device is equipped with a semiconductor chip, in which the rewiring layer and at least one of the analog circuits, formed on the circuit-formed surface and particularly susceptible to noise, such as the power circuit, operational amplifier, comparison amplifier, RF receiving part, RF transmitting part and RF synthesizer, are arranged not to overlap each other through an insulating layer, for which reason it is possible to obtain a semiconductor device, in which those circuits most susceptible to the adverse effects of noise are least liable to malfunction and deterioration in communication characteristics attributable to electrostatic induction noise or electromagnetic induction noise, and which therefore exhibits superb communication characteristics.

According to the invention, a semiconductor device is equipped with a semiconductor chip, in which out of the analog circuits on the circuit-formed surface, the coil particularly susceptible to noise and the rewiring layer are arranged not to overlap each other through an insulating layer, for which reason it is possible to obtain a semiconductor device, in which the coil most susceptible to the detrimental effects of noise is free from the action of electrostatic induction noise or electromagnetic induction noise, and which therefore exhibits superior communication characteristics.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A semiconductor chip having a rewiring layer superposed, through an insulating layer, on a circuit-formed region including a digital circuit and an analog circuit, said rewiring layer being formed integral with said chip, wherein all of or a part of said analog circuit susceptible to noise formed on said circuit-formed region and a wire forming said rewiring layer are arranged not to overlap each other through said insulating layer,
   wherein bump-setting wires are formed by wires obtained from said rewiring layer, wherein said bump-setting wires are connected at one end to input/output terminals formed in said circuit-formed region and have bumps formed at the other end thereof.

2. A semiconductor chip having a rewiring layer superposed, through an insulating layer, on a circuit-formed region including a digital circuit and an analog circuit, said rewiring layer being formed integral with said chip, wherein a wire formed from said rewiring layer and at least one of noise-susceptible circuits formed on said circuit-formed region including a power circuit, an operational amplifier, a comparison amplifier, an RE receiving part, an RF transmitting part, and an RF synthesizer, are arranged not to overlap each other through said insulating layer,
   wherein bump-setting wires are formed by wires obtained from said rewiring layer, wherein said bump-setting wires are connected at one end to input/output terminals formed in said circuit-formed region and have bumps formed at the other end thereof.

3. A semiconductor chip having a rewiring layer superposed, through an insulating layer, on a circuit-formed region including a digital circuit and an analog circuit, said rewiring layer being formed integral with said chip, wherein a noise-susceptible coil formed on said circuit-formed region and a wire formed from said rewiring layer are arranged not to overlap each other through said insulating layer.

4. A semiconductor chip according to claim 1, wherein circuits formed in said circuit-formed region constitute a radio communication circuit formed by CMOS technology.

5. A semiconductor chip having a rewiring layer superposed, through an insulating layer, on a circuit-formed region including a digital circuit and an analog circuit, said rewiring layer being formed integral with said chip, wherein all of or a part of said analog circuit susceptible to noise formed on said circuit-formed region and a wire forming said rewiring layer are arranged not to overlap each other through said insulating layer,
   wherein circuits formed in said circuit-formed region constitute a radio communication circuit for transmitting, receiving or exchanging signals of frequencies of 800 MHz or higher with an external device.

6. A semiconductor device having a semiconductor chip mounted on a substrate of predetermined dimensions and shape, wherein in said semiconductor chip, a rewiring layer is superposed on a circuit-formed region having a digital circuit and an analog circuit through an insulating layer and formed integral with said chip, and wherein a wire formed from said rewiring layer and all of or a part of said analog circuit susceptible to noise formed on said circuit-formed region are formed so as not to overlap each other through said insulating layer,
   wherein bump-setting wires are formed by wires obtained from said rewiring layer, wherein said bump-setting wires are connected at one end to input/output terminals formed in said circuit-formed region and have bumps formed at the other end thereof.

7. A semiconductor device having a semiconductor chip mounted on a substrate of predetermined dimensions and shape, wherein in said semiconductor chip, a rewiring layer is superposed on a circuit-formed region having a digital circuit and an analog circuit through an insulating layer and formed integral with said chip, and wherein a wire formed from said rewiring layer and at least one of noise-susceptible circuits formed in said circuit-formed region, including a power circuit, an operational amplifier, a comparison amplifier, an RE receiving part, a transmitting part, and an RF synthesizer are arranged not to overlap each other through said insulating layer, wherein bump-setting wires are formed by wires obtained from said rewiring layer, wherein said bump-setting wires are connected at one end to input/output terminals formed in said circuit-formed region and have bumps formed at the other end thereof.

8. A semiconductor device having a semiconductor chip mounted on a substrate of predetermined dimensions and size, wherein in said semiconductor chip, a rewiring layer is superposed on a circuit-formed region including a digital circuit and an analog circuit through an insulating layer and formed integral with said chip, and wherein a noise-susceptible coil formed in said circuit-formed region and a wire formed from said rewiring layer are arranged not to overlap each other through said insulating layer.

* * * * *